United States Patent [19]

Tang et al.

[11] Patent Number: 4,806,202

[45] Date of Patent: Feb. 21, 1989

[54] FIELD ENHANCED TUNNEL OXIDE ON TREATED SUBSTRATES

[75] Inventors: Daniel N. Tang, San Jose; Himanshu Choksi; Simon Wang, both of Sunnyvale; Simon M. Tam, San Mateo, all of Calif.

[73] Assignee: Intel Corporation, Santa Clara, Calif.

[21] Appl. No.: 104,837

[22] Filed: Oct. 5, 1987

[51] Int. Cl.$^4$ .......................................... H01L 21/312
[52] U.S. Cl. ................................... 156/657; 156/662; 437/238; 204/192.1; 148/DIG. 158
[58] Field of Search .............. 148/158; 437/228, 238, 437/225, 245, 978; 156/657, 662, 643; 204/192 R

[56] References Cited

U.S. PATENT DOCUMENTS 3,966,577   6/1976   Hochberg ..................... 204/192 R Primary Examiner—David L. Lacey
Assistant Examiner—Thi Dang
Attorney, Agent, or Firm—Blakely, Sokoloff, Taylor & Zafman

[57] ABSTRACT

A method for growing tunnel oxides on a specially treated substrate surface. The method comprises steps for roughening the substrate surface to induce low tunneling voltage in the subsequently grown tunnel oxide layer. The tunnel oxide layer is grown in a low temperature steam cycle to further provide enhanced tunneling. The surface treatment comprises the steps of growing a first oxide layer to seal the surface of the substrate followed by growing a second oxide on the first oxide layer. In the preferred embodiment, a plasma etch utilizing an oxide etcher with high energy ion bombardment and an aluminum electrode is utilized to etch through the first and second oxide layers. The aluminum electrode causes sputtered aluminum on the second oxide layer's surface. The sputtered aluminum blocks the anisotropic etching leaving a grass type oxide residue on the substrate surface. The etching continues, overetching into the substrate surface. The grass type oxide residue causes pitting to occur on the substrate surface. This pitting, resulting in sharpened features on the surface, yields enhanced tunneling characteristics for a subsequently grown tunnel oxide layer. The residue is then removed and the surface cleaned. The tunnel oxide layer is grown in a low temperture steam cycle to preserve and enhance the sharp tips for the purpose of enhanced tunneling.

11 Claims, 2 Drawing Sheets

FIG_1
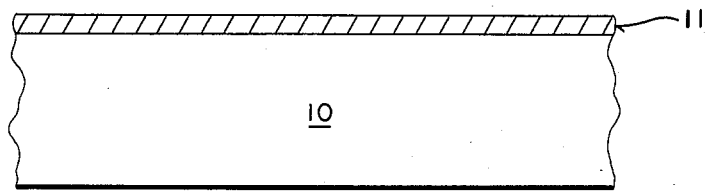
FIG_2
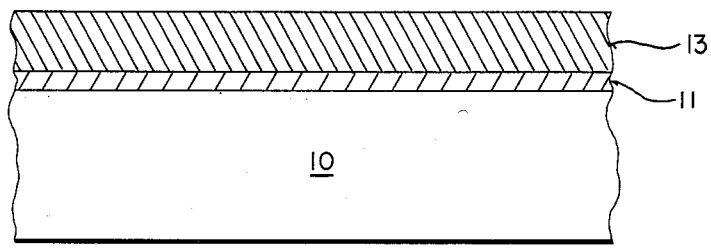
FIG_3
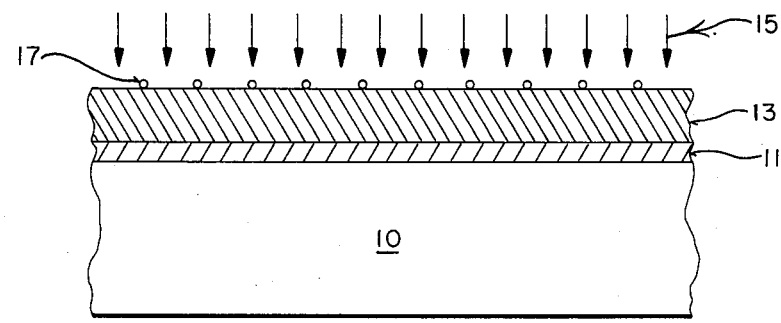
FIG_4
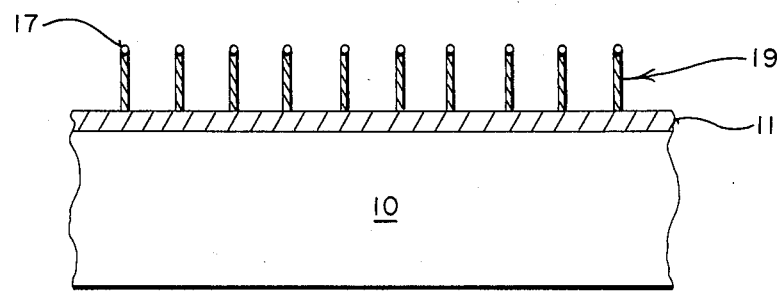

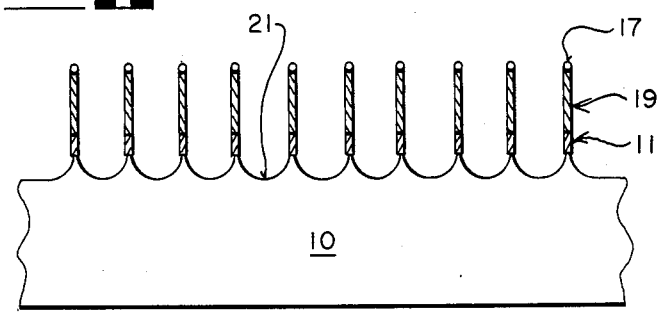
FIG_5
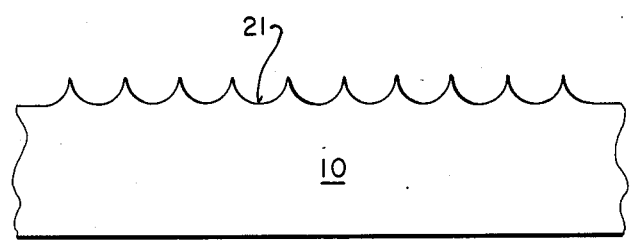
FIG_6
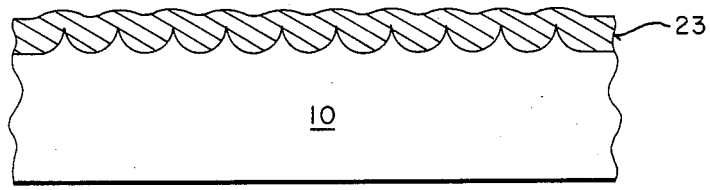
FIG_7

FIELD ENHANCED TUNNEL OXIDE ON TREATED SUBSTRATES

BACKGROUND OF THE INVENTION

1. Field of the Invention

This invention relates to the field of growing a thermal oxide layer on a substrate surface to achieve low tunneling voltage through electric field enhancement.

2. Prior Art

Tunnel oxides are an essential element in the production of EEPROM devices where electrons tunnel through the tunnel oxides to charge a floating gate to a programmed state. Erasure of the EEPROM may also be accomplished by tunneling the electrons out of the floating gate through the tunnel oxide.

One known method of achieving a tunnel oxide is to grow a thin gate oxide on a silicon surface. Typically, such a thin gate oxide suffers from several problems including weak spots in the layer causing charge retention problems. In addition, manufacturing issues with a thin gate oxide including initial defects and oxide thickness control are prevalent.

It is desired to develop a thicker tunnel oxide which still allows for a low tunneling voltage and which can be manufactured predictably and with a minimum of difficulty.

SUMMARY OF THE INVENTION

The present invention discloses a method for developing a thermal oxide layer on a specially treated substrate surface to achieve low tunneling voltage through electric field enhancement during the fabrication of floating gate electrically erasable programmable read only memories (EEPROM). The present invention discloses growing a thermal oxide layer on the substrate surface. A second oxide layer is then deposited through a chemical vapor deposition (CVD) process on the surface. A plasma etch is utilized to etch back to the substrate. An oxide etcher with high energy ion bombardment and an aluminum electrode is utilized for this etch. During the etching, aluminum sputtered from the electrode causes a grass type of oxide residue to occur due to the sputtered aluminum blocking the anisotropic oxide etching. The surface is overetched through this oxide etching process causing pitting of the substrate surface.

The grass type oxide residue is cleaned off the substrate surface using a hydrofluoric acid (HF) wet etch. An additional sulfuric clean is used to clean off the aluminum residues and a new oxide layer is grown on the surface. In the preferred embodiment, this new oxide layer is grown using a low temperature steam cycle which acts to preserve and enhance the shart tips left on the substrate surface.

BRIEF DESCRIPTION OF THE DRAWINGS

FIGS. 1 through 7 are cross-sectional views of a portion of a floating gate electrically erasable programmable read only memory (EEPROM) fabricated according to the present invention.

DETAILED DESCRIPTION OF THE PRESENT INVENTION

A method for growing a thermal oxide layer on a specially treated substrate surface in the fabrication of EEPROM devices to achieve low tunneling voltage through electric field enhancement is described. In the following description, numerous specific details are set forth such as processing temperatures, etc., in order to provide a thorough understanding of the present invention. It will be obvious, however, to one skilled in the art that the present invention may be practiced without these specific details. In other instances, well known techniques have not been shown in detail and are not to unnecessarily obscure the present invention.

A new process is proposed to grow a thermal oxide layer on a substrate yielding a high quality tunnel oxide with enhanced tunneling characteristics. The new process is composed of two processing components: a surface treatment component and an oxidation cycle. The surface treatment is described in connection with FIGS. 1 through 5 and the oxidation cycle is described in connection with FIGS. 6 and 7.

Referring now to FIG. 1, a cross-sectional view of a substrate 10 is shown. In the preferred embodiment the substrate 10 is a silicon substrate, however, it will be obvious to one of ordinary skill in the art that other substrates, such as a polycrystalline silicon, maybe utilized without departure from the spirit of the present invention. An oxide layer 11 is grown on the substrate surface 10 through a thermal oxidation process in order to seal the surface. In the preferred embodiment this layer 11 is approximately 250 Angstroms thick.

Referring now to FIG. 2, a second oxide layer 13 is deposited on the first oxide layer 11. In the preferred embodiment, layer 13 is deposited with a chemical vapor deposition (CVD) process. The layer is deposited with a thickness of approximately 5000 Angstroms.

Referring now to FIG. 3, a plasma etch process 15 utilizing an oxide etcher with high energy ion bombardment and an aluminum electrode is performed. Sputtered aluminum 17 from the electrode occurs on the surface of the oxide 13 blocking some of the etching due to the anisotropic nature of the etch. As seen in FIG. 3, the sputtered aluminum causes grass like oxide residue 19 to be formed. This etching continues to the surface of the substrate 10.

In the preferred embodiment, this etching utilizes a pressure of 500 mT, power of 400 watts, a gap of 0.6 cm, a $C_2F_6$ flow rate of 100 SCCM and a helium flow rate of 50 SCCM. This step continues to the end point detected by an oxide etch end point detection monitor.

The substrate surface is overetched using the oxide etcher which pits the substrate surface. This overetching 21 is illustrated in FIG. 5. The overetching step utilizes an oxide etching process to pit the surface of the substrate 10. The pitting process is controlled by the oxide etching selectivity with a lower selectivity resulting in a deeper pitting and rougher surface.

In the preferred embodiment, the overetching step is done at a pressure of 500 mT, with a power of 275 watts and a gap of 1.0 cm. The $C_2F_6$ flow rate is 125 SCCM with no helium flow. It is desired to achieve approximately a 15 to 75 per cent over etch.

The second process component, an oxidation cycle takes place. Referring now to FIG. 6, the grass residue is removed. In the preferred embodiment, the grass residue is removed by dipping in a hydrofluoric acid (HF) wet etch. This leaves the substrate 10 with a pitted surface 21. The substrate surface 10 is cleaned using a sulfuric/peroxide clean followed by the RCA standard clean cycles. The RCA standard clean cycles, SC1 and SC2, are well known in the art. One description of these cycles may be found in "Hydrogen Peroxide Solutions for Silicon Wafer Cleaning" by W. Kern, RCA Engineer, Volume 28-4, pages 99–105, July/August 1983.

Referring now to FIG. 7, a new oxide layer 23 is grown on the substrate 10. In the preferred embodiment, a low temperature steam cycle is utilized to grow this oxide layer 23. The temperature utilized by the preferred embodiment is approximately 920° or lower with a partial steam cycle (16%). The oxide is grown to a thickness of approximately 500 Angstroms or less on the substrate. The use of a low temperature steam cycle for the oxidation preserves and enhances the sharp tips for the purpose of enhanced tunneling.

The described surface roughening process generates sharp silicon textures of a submicron size. The subsequent oxidation cycle enhances the sharp surface because higher stress at the sharp features causes a lower oxidation reaction rate compared to the oxidation reaction rate on a flat surface.

The textured surface yields a lower tunneling voltage compared to a flat surface due to local field enhancement around the sharp features. With such field enhancement, Fowler-Nordheim tunneling can occur at a lower average electric field and with a relative thicker oxide. Lower tunneling voltage, in turn, reduces wear out problems due to program and erase cycling of EEPROM devices. Thicker oxides may reduce initial defects and lessen manufacturing concerns associated with thin oxides.

Thus, a process for yielding an improved surface for growing tunnel oxides is disclosed.

We claim:

1. A process for growing a tunnel oxide on a silicon substrate, comprising the steps of:
   growing a first oxide layer on said silicon substrate;
   depositing a second oxide layer on said first oxide layer;
   plasma etching said second and said first oxide layers with an anisotropic oxide etcher utilizing high energy ion bombardment with a metal electrode, said etcher sputtering metal on said second oxide layer, said metal causing grass-type formation during said etching;
   overetching through said first and second oxide layers and into said silicon substrate surface forming a pitted substrate surface.
   removing residual first and second oxide layers;
   growing a third oxide layer on said pitted substrate.

2. The process, as recited in claim 1, wherein said first oxide layer is thermally grown to a thickness of approximately 250 Angstroms.

3. The process, as recited by claim 1, wherein said second oxide layer is deposited by a chemical vapor deposition (CVD) process to a thickness of approximately 5000 Angstroms.

4. The process, as recited in claim 1, wherein said third oxide layer is grown in a low temperature steam cycle, enhancing tips of said pitted substrate surface.

5. The process as recited in claim 1, further comprising the step of cleaning said substrate after removing residual first and second oxide layers and before growing said third oxide layer.

6. In a process for growing a tunnel oxide on a substrate, said tunnel oxide allowing the charging and discharging of a floating gate in an erasable electrically programmable read only memory (EEPROM), an improvement comprising the steps of:
   thermally growing a first oxide layer on said substrate;
   depositing a second oxide layer on said substrate by a chemical vapor deposition (CVD) process;
   plasma etching said first and second oxide layers using an anisotropic oxide etcher with high energy ion bombardment and an aluminum electrode, said aluminum electrode causing sputtering of aluminum onto the surface of said second oxide layer, said sputtered aluminum causing grass type oxide residue to occur on the surface of said substrate;
   overetching through said first and second oxide layers and into said substrate surfaces, causing pitting of said substrate surface during said overetch;
   removing said grass type oxide residue;
   cleaning the pitted surface of said substrate;
   growing a third oxide layer on said substrate.

7. The process, as recited by claim 6, wherein said first oxide layer is approximately 250 Angstroms thick.

8. The process, as recited by claim 7, wherein said second oxide layer is approximately 5000 Angstroms thick.

9. The process, as recited by claim 8, wherein said grass type oxide residue is removed by a hydrogen fluoride (HF) wet etch.

10. The process, as recited by claim 9, wherein said third oxide layer is approximately 500 Angstroms thick.

11. The process, as recited by claim 6, wherein said third oxide layer is grown in low temperature steam cycle thereby enhancing the tips of the pitted surface of said substrate such that electron tunneling can occur at a lower tunneling voltage.

* * * * *